(12) United States Patent  
Cok et al.

(10) Patent No.: US 7,034,470 B2
(45) Date of Patent: Apr. 25, 2006

(54) SERIALLY CONNECTING OLED DEVICES FOR AREA ILLUMINATION

(75) Inventors: Ronald S. Cok, Rochester, NY (US); Yuan-Sheng Tyan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 148 days.

(21) Appl. No.: 10/214,035

(22) Filed: Aug. 7, 2002

(65) Prior Publication Data

US 2004/0032220 A1 Feb. 19, 2004

(51) Int. Cl.
*F21V 29/00* (2006.01)
*H05B 37/00* (2006.01)

(52) U.S. Cl. .................. 315/249; 315/185 R
(58) Field of Classification Search .. 315/169.1–169.4, 315/291, 185 S, 185 R, 318, 312, 316, 324, 315/200 A; 313/504–507, 511, 498–500, 313/113; 362/246, 276, 249, 237, 800, 545
See application file for complete search history.

(56) References Cited

U.S. PATENT DOCUMENTS

| | | | | |
|---|---|---|---|---|
| 4,476,292 A | | 10/1984 | Ham et al. ............ 518/60 |
| 4,935,665 A | * | 6/1990 | Murata ............... 313/500 |
| 5,247,190 A | | 9/1993 | Friend et al. .......... 257/40 |
| 5,681,756 A | * | 10/1997 | Norman et al. ......... 438/35 |
| 5,850,126 A | * | 12/1998 | Kanbar ............. 315/200 A |
| 5,858,561 A | * | 1/1999 | Epstein et al. ......... 428/690 |
| 5,895,228 A | * | 4/1999 | Biebuyck et al. ........ 438/99 |
| 5,949,347 A | * | 9/1999 | Wu ................. 340/815.45 |
| 6,036,336 A | * | 3/2000 | Wu ..................... 362/249 |
| 6,184,628 B1 | * | 2/2001 | Ruthenberg ......... 315/185 R |
| 6,335,548 B1 | * | 1/2002 | Roberts et al. .......... 257/98 |
| 6,337,492 B1 | * | 1/2002 | Jones et al. ............ 257/40 |
| 6,502,956 B1 | * | 1/2003 | Wu ..................... 362/237 |
| 6,538,375 B1 | * | 3/2003 | Duggal et al. .......... 313/506 |
| 6,558,021 B1 | * | 5/2003 | Wu et al. ............... 362/249 |
| 6,566,824 B1 | * | 5/2003 | Panagotacos et al. .... 315/291 |
| 6,598,996 B1 | * | 7/2003 | Lodhie ................. 362/249 |
| 6,667,791 B1 | * | 12/2003 | Sanford et al. ......... 349/139 |
| 6,709,132 B1 | * | 3/2004 | Ishibashi .............. 362/249 |
| 6,786,625 B1 | * | 9/2004 | Wesson ................ 362/545 |
| 6,800,999 B1 | * | 10/2004 | Duggal et al. ........ 315/169.1 |
| 6,820,998 B1 | * | 11/2004 | Chen ................... 362/276 |
| 2002/0191396 A1 | * | 12/2002 | Reiff et al. ............ 362/246 |

* cited by examiner

*Primary Examiner*—Wilson Lee
(74) *Attorney, Agent, or Firm*—Andrew J. Anderson

(57) ABSTRACT

An area illumination apparatus, including a multiplicity of spaced-apart OLED devices electrically connected in series including a common substrate and each OLED device formed simultaneously over the common substrate; and a power source connected to the first and last OLED devices of the series of spaced-apart OLED devices. The series of OLED devices formed simultaneously on a common substrate can be manufactured in situ. Moreover, by serially connecting the OLED devices the application of power to the devices is simplified. A socket can be used to readily adapt the area illumination apparatus for use with the existing lighting infrastructure.

42 Claims, 9 Drawing Sheets

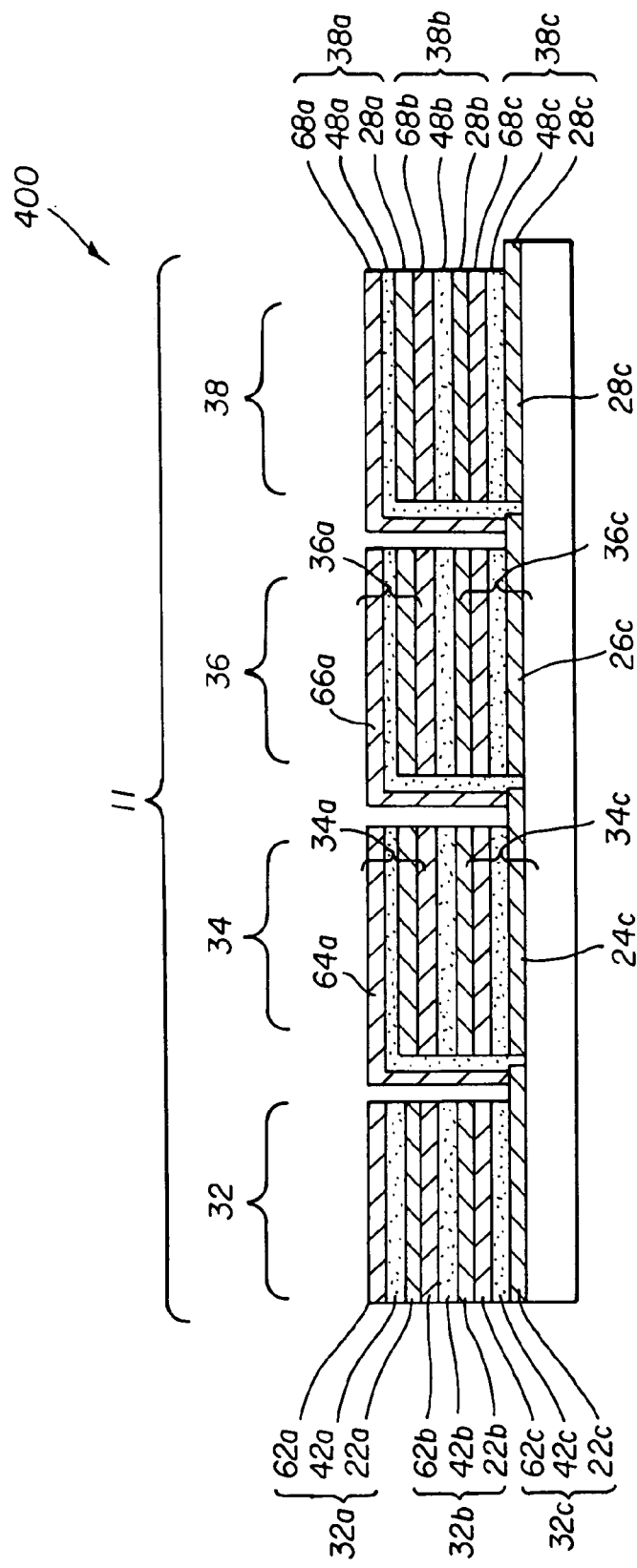

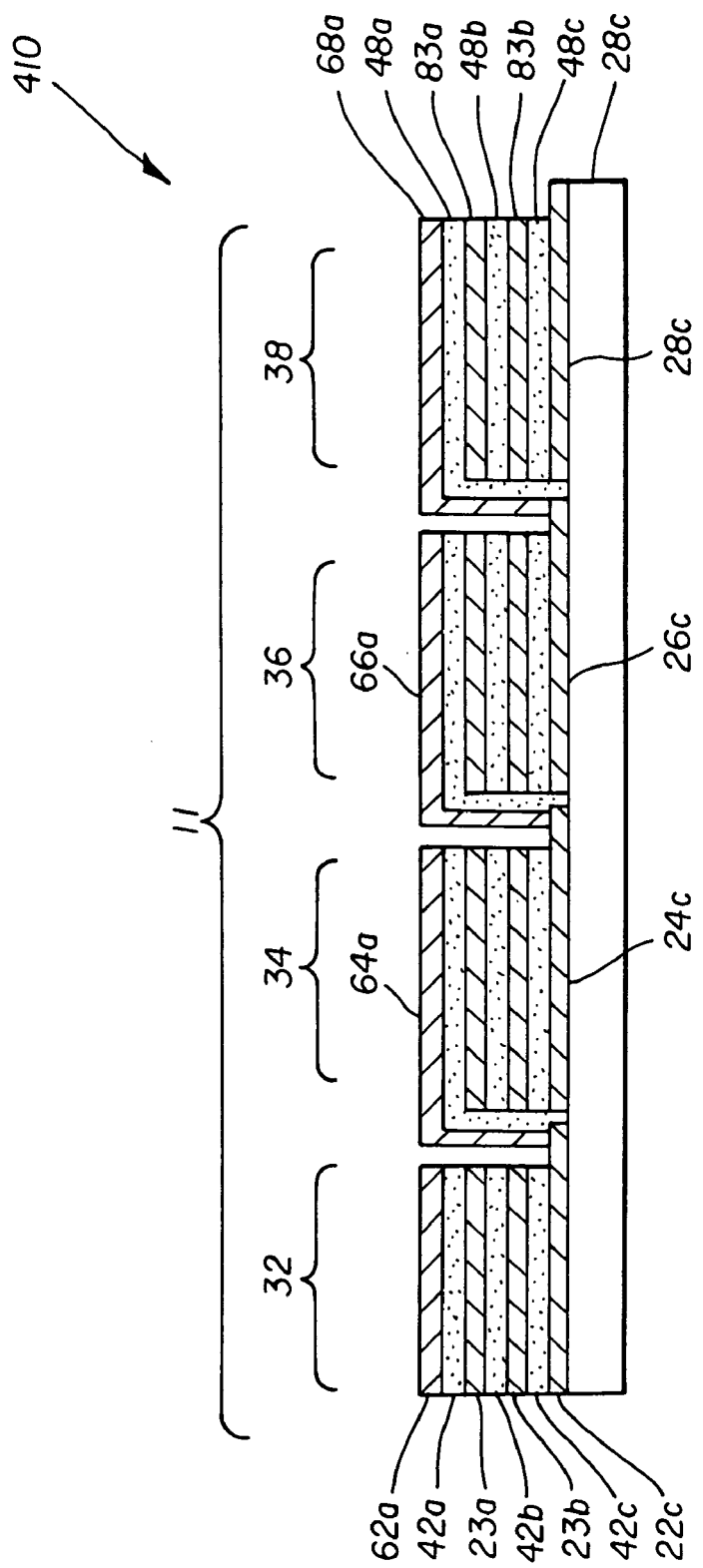

SERIALLY CONNECTING OLED DEVICES FOR AREA ILLUMINATION

CROSS REFERENCE TO RELATED APPLICATIONS

References is made to commonly assigned U.S. patent application Ser. No. 10/213,853 filed concurrently herewith, entitled "OLED Apparatus Including a Series of OLED Devices" by Yuan-Sheng Tyan, now U.S. Pat. No. 6,693,296, and U.S. patent application Ser. No. 10/077,270 filed Feb. 15, 2002 entitled "Providing an Organic Electroluminescent Device Having Stacked Electroluminescent Units" by Liang-Sheng L. Liao et al. now U.S. Pat. No. 6,872,472, the disclosures of which are incorporated herein by reference.

FIELD OF THE INVENTION

The present invention relates to organic light emitting diodes (OLEDs) for area illumination.

BACKGROUND OF THE INVENTION

Solid-state lighting devices made of light emitting diodes are increasingly useful for applications requiring robustness and long-life. For example, solid-state light emitting diodes (LED) are found today in automotive applications. These devices are typically formed by combining multiple, small LED devices providing a point light source into a single module together with glass lenses suitably designed to control the light as is desired for a particular application (see, for example WO99/57945). These multiple devices are expensive and complex to manufacture and integrate into a single area illumination apparatus. Moreover, LED devices provide point sources of light which are not preferred for area illumination (see for example U.S. Pat. No. 6,305,818).

Organic light emitting diodes (OLEDs) can be manufactured by depositing materials on a substrate. This process enables the creation of single, monolithic lighting elements on a single substrate. The existing art describes the use of electro-luminescent materials as adjuncts to conventional lighting (for example U.S. Pat. No. 6,168,282 "Electro-Luminescent lighting Arrangement for a Lighting Apparatus with a Lamp Holder" granted to Chien). In this case, the electro-luminescent material is not useful for primary lighting. EP1120838A2 describes a method for mounting multiple tiles on a mounting substrate to create large arrays of illuminators. However, this is complex and expensive and is not necessary for some applications.

It is also important that lighting devices in common use by consumers be compatible with the existing lighting infrastructure, for example the common screw-type base known in the US and the pin-type bayonet bases used in Europe. Moreover, the lighting devices must be readily and safely replaced by consumers at minimal cost.

Applications for OLED devices in area illumination are constrained by cost. The traditional way of providing power to OLED devices using conventional power supplies are too expensive for illumination applications. Techniques used for traditional inorganic, point-source LED devices are not suitable as they do not supply, for example, reverse bias to prolong the useful life of an OLED device.

There is a need therefore for replaceable OLED area illuminators having a simple construction, low cost, and compatibility with the existing lighting infrastructure.

SUMMARY OF THE INVENTION

It is an object of the present invention to provide an effective area illumination apparatus that makes use of OLED devices.

It is another object of the invention to provide an area illumination apparatus made of OLED devices that can be effectively manufactured in situ.

These objects are achieved by an area illumination apparatus, comprising (a) a multiplicity of spaced-apart OLED devices electrically connected in series including a common substrate and each OLED device formed simultaneously over the common substrate; and (b) a power source connected to the first and last of the series of spaced-apart OLED devices.

The present invention provides an area illumination apparatus that makes use of the advantages of OLED devices. The present invention by forming a series of OLED devices on a common substrate can be manufactured in situ. Moreover, by serially connecting the OLED devices the application of power to the devices is simplified. The present invention can be used with different AC voltages, frequencies, and phases. A socket can be used to readily adapt the present invention for use with the existing lighting infrastructure.

BRIEF DESCRIPTION OF THE DRAWINGS

FIG. 7a is a schematic illustration of the cross section of an area illumination apparatus in accordance with the present invention comprising a string of serially connected stacked OLED devices including inter-device electrodes disposed between neighboring individual light emitting devices;

FIG. 7b is a schematic illustration of the cross section of an area illumination apparatus in accordance with the present invention comprising a string of serially connected stacked OLED devices including doped organic connectors disposed between neighboring individual light emitting devices;

It will be understood that the figures are not to scale since the individual layers are too thin and the thickness differences of various layers too great to permit depiction to scale.

DETAILED DESCRIPTION OF THE INVENTION

Figure 1A:
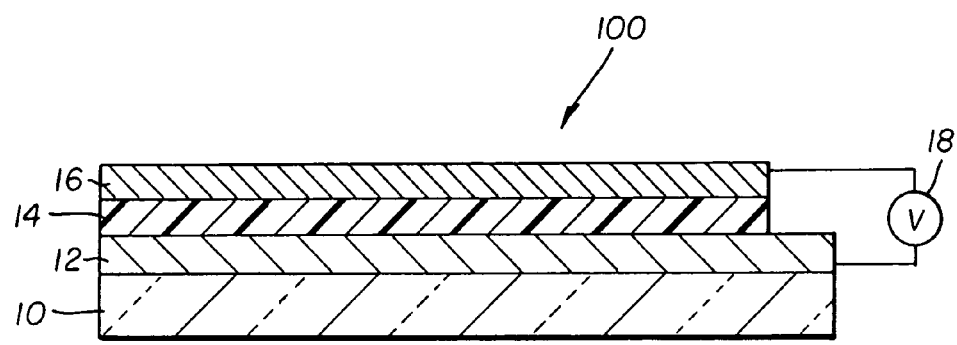
FIG. 1a illustrates a partial cross section of a prior art OLED device.

Referring to FIG. 1a, a prior art OLED device 100 is manufactured on a single substrate 10 and incorporates at least one organic EL element 14. Conductive elements 12 and 16 are deposited beneath and above the light emitting materials to provide power to the organic EL element 14. A cover (not shown) is affixed to the substrate 10 and above the organic EL element 14 to protect the materials and hermetically seal the OLED device 100 to prevent moisture from contaminating the materials. Alternatively, a sealing layer (not shown) is deposited over the organic EL element 14 to protect the materials. A power supply 18 is electrically connected to conductive elements 12 and 16 to provide power for OLED device 100.

Figure 1B:
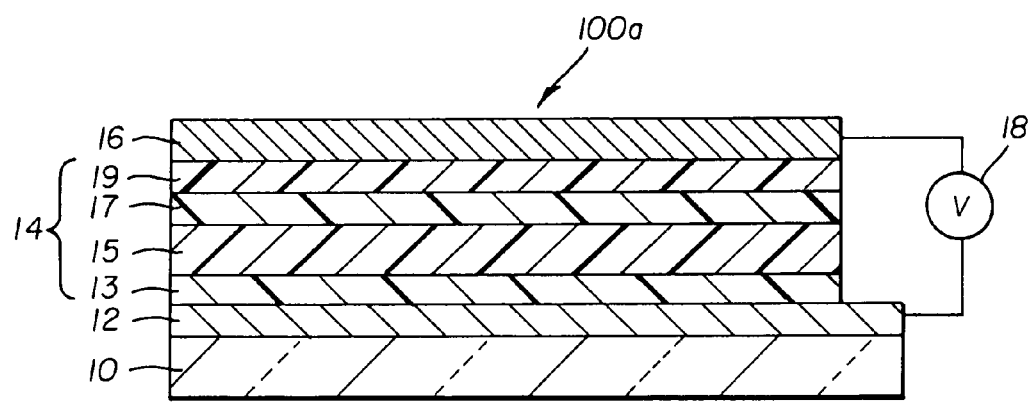
FIG. 1b illustrates a partial cross section of another common prior art OLED device.

There are numerous configurations of the organic EL element 14 wherein the present invention can be successfully practiced. A typical structure 100a is shown in FIG. 1b and is includes a substrate 10, a first conductive element 12, an organic EL element 14 and a second conductive element 16, wherein the an organic EL element 14 includes a hole-injecting layer 13, a hole-transporting layer 15, a light-emitting layer 17, and an electron-transporting layer 19 The total combined thickness of EL organic element 14 is preferably less than 500 nm. These layers are described in detail below. Note that the substrate may alternatively be located adjacent to the cathode, or the substrate may actually constitute the anode or cathode.

The present invention is applicable to an area illumination apparatus including strings of serially connected spaced-apart OLED devices deposited on a common substrate. Each OLED device emits light through either the common substrate on which the materials are deposited (if the common substrate is transparent) or through the cover or cover layer (if the cover is transparent). Alternatively, both the common substrate and the cover or cover layer can be transparent. Moreover, to minimize cost of manufacture, assembly, and design and to maximize the robustness of the area illumination apparatus, the materials are preferably deposited onto a single common substrate (rather than applying separate tiled display elements to a second substrate). The substrate can be rigid and made of a variety of materials, for example glass. Alternatively, the substrate can be flexible or a flexible substrate can be applied to a second, rigid substrate on one or both sides.

Figure 2A:
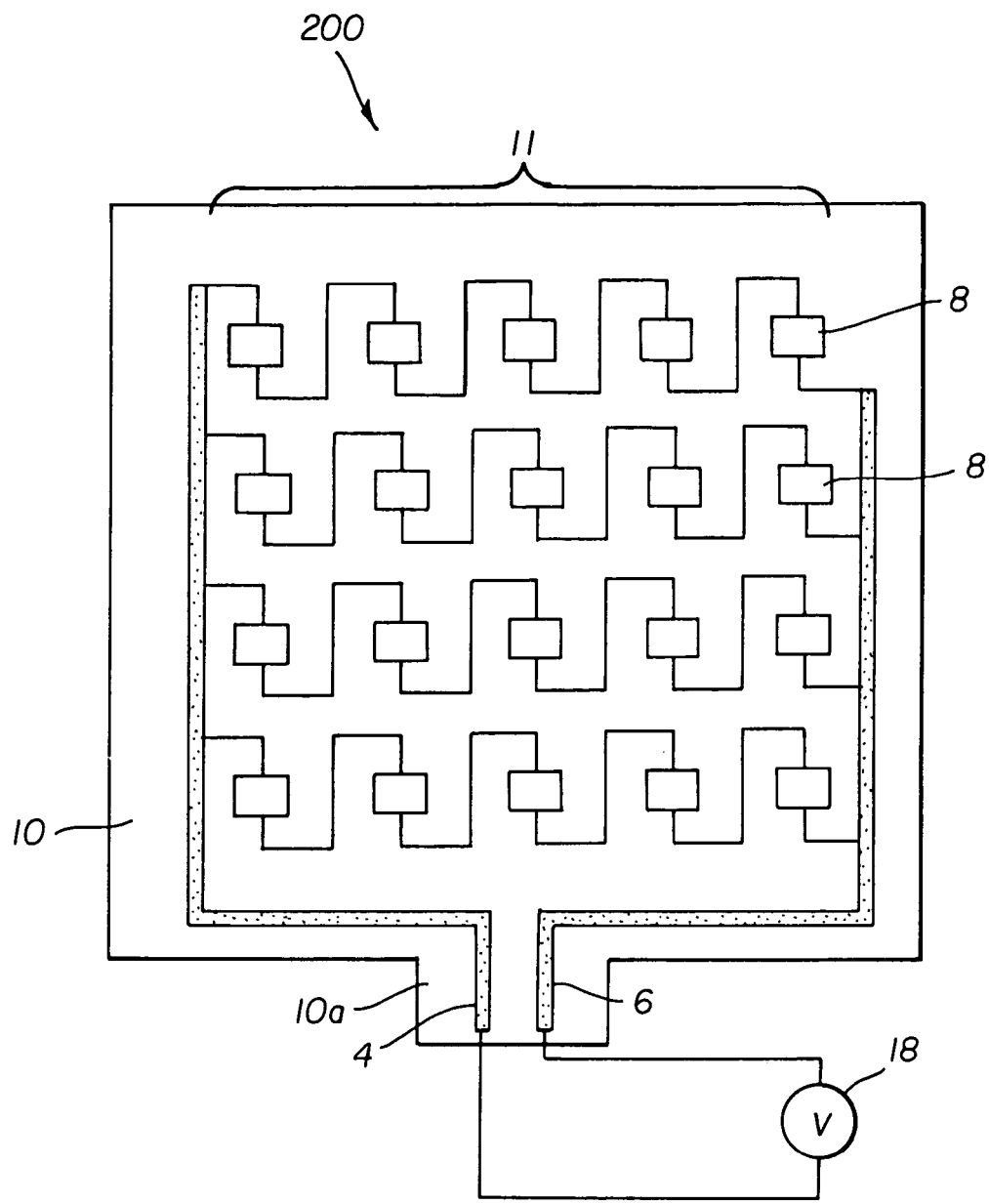
FIG. 2a is an area illumination apparatus in accordance with the present invention that uses a plurality of strings of serially connected OLED devices formed on a common substrate.

Referring to FIG. 2a, an area illumination apparatus 200 is shown to include a plurality of strings 11 connected in parallel. Each string 11 of serially connected OLED devices 8 includes a plurality of spaced-apart OLED devices 8 electrically connected in series and includes a common substrate 10. Each OLED device 8 is formed simultaneously over the common substrate 10. The area illumination apparatus 200 includes a power supply 18 that is connected to the first and last spaced-apart OLED devices of each string 11 of serially connected OLED devices 8. The area illumination apparatus 200 can be substantially fabricated in situ using, for example, a single vacuum chamber together with a structure that permits the deposition of different layers over the common substrate 10. The vacuum chamber can include one or more boats which receive organic and inorganic materials that, when heated, vaporize and deposit on the substrate in sequence. This arrangement makes use of the advantages of OLED devices on a common substrate than can be manufactured in situ. By serially connecting the OLED devices the application of power to the devices is simplified. The present invention can be used with different AC voltages, frequencies, and phases. The substrate 10 is shown to include a tab 10a located at one end of the substrate 10. The conductive elements 4 and 6 (see FIGS. 2a and 2b) are exposed on tab 10a and connected to power supply 18. Conductive elements 4 and 6 conduct power from the tab 10a to the first and last OLED device 8 in each string of the plurality of serially connected OLED devices.

Figure 2B:
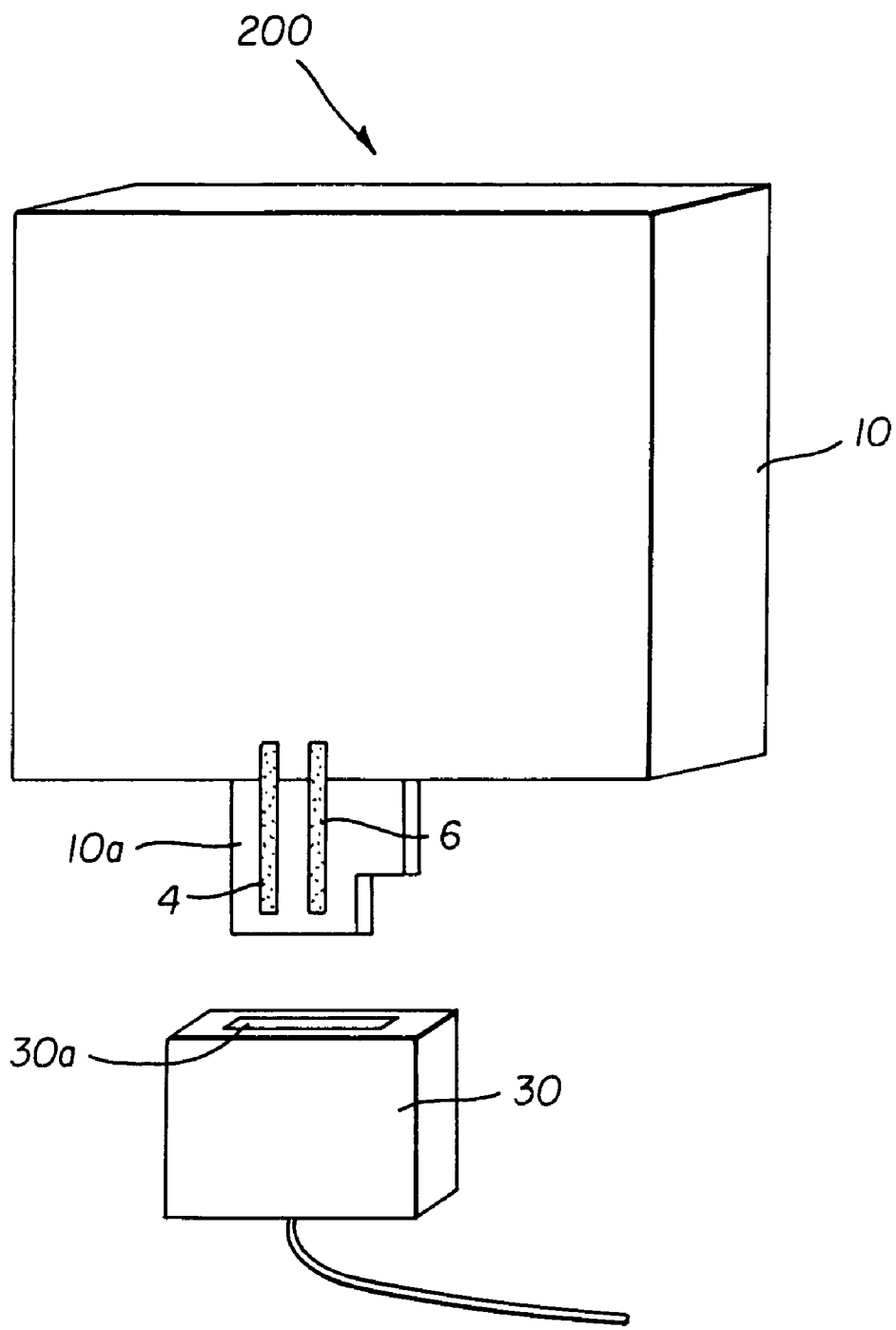
FIG. 2b is a schematic showing an area illumination apparatus with a substrate tab and a matching socket according to the present invention.

Referring to FIG. 2b, the area illumination apparatus has a plurality of strings 11 of serially connected OLED devices 8 (not shown in this view for clarity of illustration) that produce light such as shown in FIG. 2a. Tab 10a located at one end of the substrate 10 is structured to mechanically accept a complementary socket opening 30a. A socket 30 is provided to conduct power from an external source (such as a household electrical grid, not shown) to the tab 10a and thence to the first and last OLED devices of each string 11 of serially connected OLED devices 8, causing the OLED materials in the organic EL element 14 to emit light and thereby provide area illumination. The tab 10a is preferably configured to ensure that it can only be inserted into the socket 30 in one way (i.e. cannot be inserted backwards). Within the socket opening 30a there are provided conductors complementary to the tabs 10a that provide current to the conductive elements 4 and 6 when the substrate 10 is inserted into the socket 30. The substrate 10 can be physically removed from the socket 30 by pulling the substrate 10 out of the socket 30 and a second substrate inserted by pushing the substrate 10, with the tab properly aligned in the socket 30. The socket 30 can preferably include power-conditioning circuitry to convert the electrical power conventionally available to the proper form suitable for powering the OLED area illumination apparatus as well a conventional switch, if desired.

In particular, the OLED area illumination apparatus can prefer a particular rectified voltage with a suitable waveform; the power modifying circuitry provides that using conventional power circuitry. In particular, the power modifying circuitry can include means to periodically reverse bias the light emitting organic materials.

In a preferred embodiment, the substrate and materials are manufactured separately from the sockets so that the sockets can be customized to markets with different power systems. The substrates, in contrast, are standardized and can be used with any socket so as to provide advantages of manufacturing and marketing scale. Moreover, substrates with different shapes or other attributes useful in a specific application can be employed with a common socket, thereby decreasing costs and improving usefulness.

The brightness of the light emitting materials can be controlled either by modulating or reducing the power provided to the materials. In particular, pulse-width modulation schemes well known in the art can be employed (see for example, EP1094436A2) and implemented by the power modifying circuitry. Alternatively, the level of power provided to the light emitting area can be reduced, for example by reducing the voltage or current supplied to the light emitting materials. A brightness control switch can be integrated into the socket, for example with a rotary, variable resistance switch formed as a ring or a slider. The socket can also include a conventional switch to turn the area illumination apparatus on and off. An external switch (either on/off or variable) can also provide means for controlling the brightness of the OLED area illumination apparatus.

In a preferred embodiment, the socket is wired directly to the local power grid. Alternatively, the socket can be inserted into a conventional socket (for example with a screw-or bayonet-type socket) or, in other applications, include the prongs of a plug and be inserted directly into a wall or extension cord plug.

The preferred voltage drop across a single OLED device in a series of OLED devices varies from several volts to 20 or 30 volts, depending on the nature of the OLED. Power from the local power grid is conventionally 110 volts or 240 volts and, if applied directly to an OLED device, would destroy it. Therefore, in the present invention, a single OLED area illumination apparatus includes a plurality of OLED devices connected in series as shown in FIG. 2a and FIG. 3.

Figure 3:
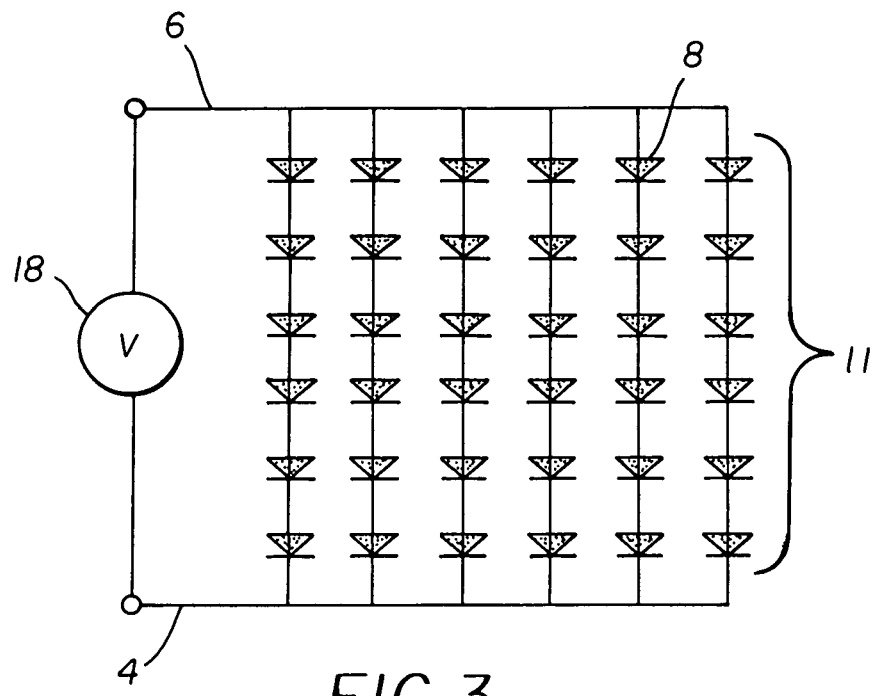
FIG. 3 is a schematic showing an area illumination apparatus according to the present invention with a plurality of strings of serially connected OLED devices connected to a power supply.

Referring particularly to FIG. 3, the voltage drop and current flowing through each string 11 of the serially connected OLED devices 8 can be adjusted by adjusting the number of OLED devices 8 connected in the series. When the power supply 18 (AC power) applies a voltage in a forward direction across each string 11 of the serially connected OLED devices 8, each OLED device 8 will consume a portion of the power available and emit light. When the AC line voltage is negative, the OLED devices 8 will not emit light. However, because the lifetime of an OLED devices 8 can be extended by periodic reverse biasing, the negative line voltage can serve to reverse bias the OLED devices 8.

It is useful to create groups of strings 11 of serially connected OLED devices 8 to provide redundancy in the area illumination apparatus so that if one string 11 of serially connected OLED devices 8 fails, the remaining strings 11 of serially connected OLED devices 8 can continue to emit light. Moreover, strings 11 of serially connected OLED devices 8 connected to an AC power supply will only emit light when forward biased so that the duty cycle of the light is 50% and can have significant flicker.

Figure 4:
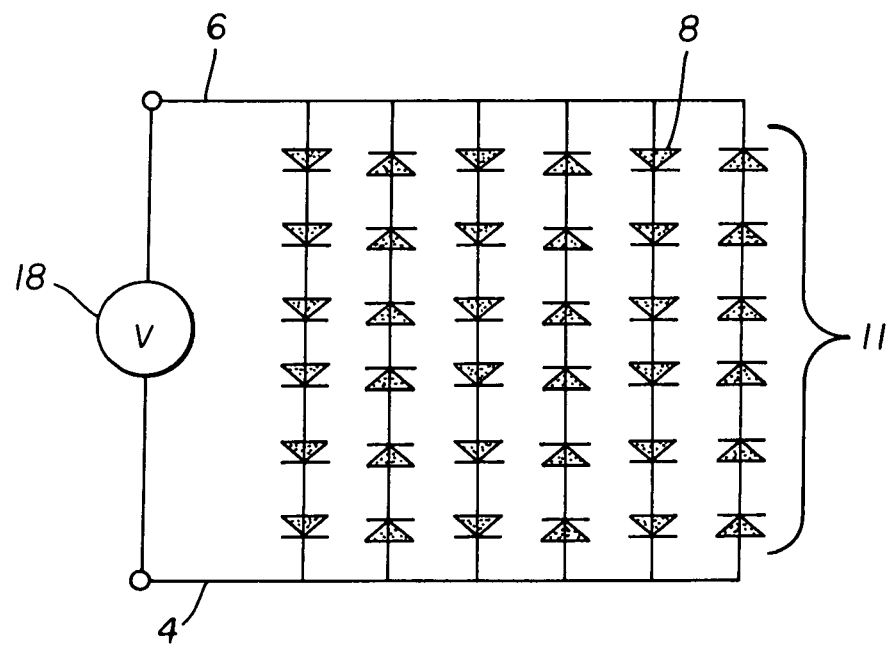
FIG. 4 is a schematic diagram showing pairing of two strings of series-connected OLED devices according to the present invention.

As shown in FIG. 4, by pairing two strings 11 of serially-connected OLED devices 8 and connecting one in reverse of the other so that the positive side of one string 11 of serially connected OLED devices 8 is connected to the negative side of the other string 11 of serially connected OLED devices 8 in the pair and vice versa, one of string 11 of serially connected OLED devices 8 in each pair will always be positively biased and emitting light, thereby increasing the duty cycle to 100% and reducing flicker. The present invention can be extended to groups of four strings 11 of serially connected OLED devices 8, each 90 degrees out of phase with the next, and thereby further reducing observed flicker.

If a lower voltage or a direct current power supply is desired for the area illumination apparatus, a conventional transformer and power supply can be used to convert the power for the area illumination apparatus. A design with limited power loss is preferred. For example, a direct current supply can be created with conventional half- and full-wave rectifier circuits as is known in the art. These can be coupled with conventional transformers or not.

Figure 5:
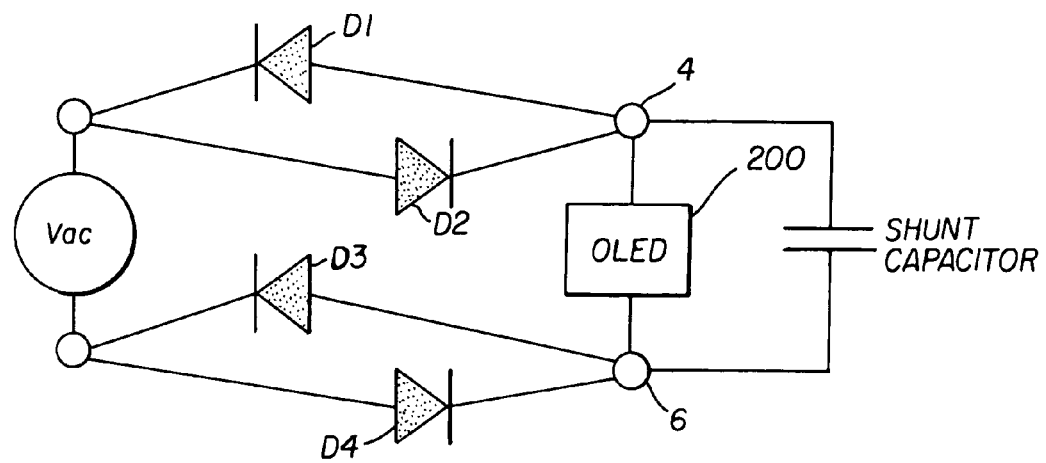
FIG. 5 is a schematic diagram of a bridge circuit composed of diodes according to the present invention.

As shown FIG. 5, in one embodiment, a bridge circuit composed of diodes (D1–D4) and no transformers reduces circuit power losses and provides a simple means of providing a DC power supply to an OLED area illumination apparatus 200. The power supply can be further improved by using a shunt capacitor C across the area illumination apparatus 200.

The present invention can provide a colored area illumination apparatus by making the various strings 11 of serially connected OLED devices 8 of different materials that emit light in different colors. By providing power to different combinations of the strings, different effects can be obtained. One simple way to implement a multi-color area illumination apparatus is to provide strings 11 of serially connected OLED devices 8 in red, green, and blue. A single switch (not shown) can sequentially power first the red, then the red and green to form yellow, then red and green and blue to form white, then green and blue to cyan, then blue and red to form magenta, then green, and finally blue. If the switches for each of the colors are sequentially placed in a rotary switch and the switch has three sequential connections followed by a gap followed by a final, single connection, the sequence described above is obtained. A similar switch can be used to sequentially power parallel groups to provide variable brightness illumination.

The present invention can be employed in a wide variety of conventional applications, for example in a table-top lamp, floor-lamp, or chandelier. Alternatively, the invention can be employed as a flat-panel illumination device for a conventional suspended ceiling. The present invention can also be employed in portable illumination devices using DC power sources.

In a preferred embodiment, the invention is employed in a device that includes Organic Light Emitting Diodes (OLEDs) which are composed of small molecule polymeric OLEDs as disclosed in but not limited to commonly-assigned U.S. Pat. No. 4,769,292, issued Sep. 6, 1988 to Tang et al., entitled "Electroluminescent Device with Modified Thin Film Luminescent Zone" and commonly-assigned U.S. Pat. No. 5,061,569, issued Oct. 29, 1991 to VanSlyke et al., entitled "Electroluminescent Device with Organic Electroluminescent Medium. Many combinations and variations of organic light emitting materials can be used to fabricate such a device.

Substrate

The OLED apparatus of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is viewed through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes or by using shadow masks during preparation.

Hole-Injecting Layer (HIL)

It is often useful to provide a hole-injecting layer between the anode and the emissive layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly assigned U.S. Pat. No. 4,720,432, and plasma-deposited fluorocarbon polymers as described in commonly assigned U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al in commonly-assigned U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in commonly-assigned U.S. Pat. Nos. 4,769,292 and 5,935,721, the light-emitting layer (LEL) of the organic EL element includes a luminescent or fluorescent material where electroluminescence is produced as a result of electron-hole pair recombination in this region. The light-emitting layer can include a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly assigned U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2''-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in commonly assigned U.S. Pat. No. 4,356,429 and various heterocyclic optical brighteners as described in commonly assigned U.S. Pat. No. 4,539,507. Benzazoles and triazines are also useful electron-transporting materials.

In some instances, the light-emitting layer and electron-transport layers can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

When light emission is viewed solely through the anode, the cathode used in this invention can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in commonly assigned U.S. Pat. No. 4,885,221. Another suitable class of cathode materials includes bilayers including a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in commonly assigned U.S. Pat. No. 5,677,572. Other useful cathode material sets include, but are not limited to, those disclosed in commonly assigned U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236. EP 1 076 368, and JP 3,234,963. Cathode materials are typically deposited by evaporation, sputtering, or chemical vapor deposition. When needed, patterning can be achieved through many well known methods including, but not limited to, through-mask deposition, integral shadow masking as described in commonly assigned U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in commonly-assigned U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (commonly-assigned U.S. Pat. No. 5,294,870), spatially-defined thermal dye transfer from a donor sheet (commonly-assigned U.S. Pat. Nos. 5,851,709 and 6,066,357) and inkjet method (commonly-assigned U.S. Pat. No. 6,066,357).

Encapsulation

Most OLED apparatus are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

The OLED area illumination apparatus of this invention employs a plurality or series of OLED devices that use various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a, polarizing medium over the display, or providing colored, neutral density, or color conversion filters over the display. Filters, polarizers, and anti-glare or antireflection coatings may be specifically provided over the cover or as part of the cover.

Figure 6:
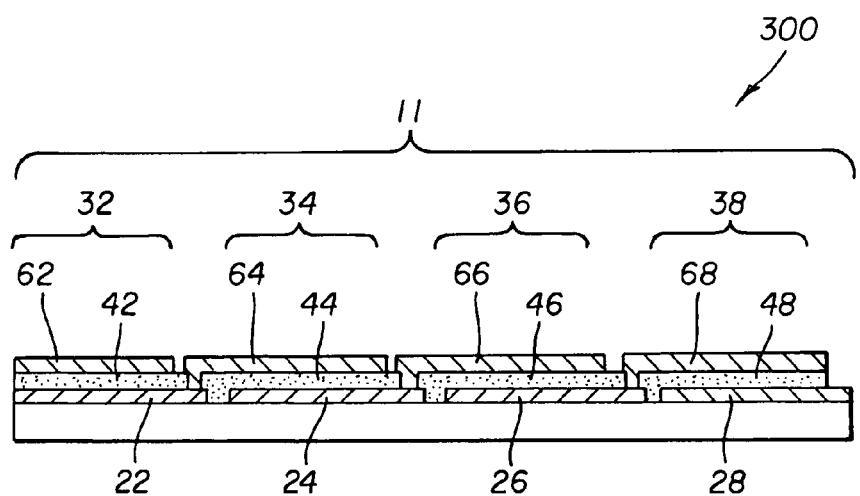
FIG. 6 is a schematic illustration of the cross section of an area illumination apparatus in accordance with the present invention comprising a string of serially connected OLED devices on a common substrate.

FIG. 6 is a schematic representation of the cross-section of an OLED apparatus 300 according to the present invention having a plurality of OLED devices 32, 34, 36, and 38 connected in series to form a string 11. For ease of illustration, only four OLED devices 32, 34, 36, and 38 are shown. It is understood that in devices most applications many more OLED devices will be involved. On top of substrate 10 there is a plurality of spaced apart bottom electrodes 22, 24, 26, and 28 one for each OLED device. The spaced apart bottom electrodes 22, 24, 26, and 28 can be provided by vacuum deposition through masks or printed into the desired pattern using ink containing the electrode material. Alternatively, the spaced apart bottom electrodes 22, 24, 26, and 28 can be prepared in a continuous layer and divided into the desired spaced apart pattern using photolithography, laser scribing, or mechanical scribing. Over the spaced apart bottom electrodes 22, 24, 26, and 28, there is disposed a plurality of spaced apart organic EL elements, 42, 44, 46, and 48. Each one of the spaced apart organic EL elements 42, 44, 46 and 48 has at least one organic layer that extends over an edge of its corresponding spaced apart bottom electrodes 22, 24, 26 and 28. In FIG. 3 each spaced apart organic EL elements 42, 44, 46, and 48 covers the left edge of its corresponding spaced apart bottom electrodes 22, 24, 26 and 28. The organic layers of each organic EL element 42, 44, 46 and 48 can end in the space between adjacent spaced apart bottom electrodes 22, 24, 26, and 28 or it can extend beyond the space and covers the right edge of the next spaced apart bottom electrode 22, 24, 26, and 28 to its left. Over the spaced apart organic EL elements 42, 44, 46 and 48, there is disposed a plurality of spaced apart top electrodes 62, 64, 66, and 68. Each spaced apart top electrode 62, 64, 66, and 68 is disposed over a substantial portion of its corresponding spaced apart organic EL element 42, 44, 46, and 48. A set of corresponding spaced apart bottom electrode, spaced apart organic EL element, and spaced apart top electrode forms an OLED device that can emit light. Each spaced apart top electrode extends beyond the space between its corresponding bottom electrode and the next space apart bottom electrode and makes electrical contact with the latter. Thus the spaced apart top electrode of OLED device 38 contacts the spaced apart bottom electrode of OLED device 36; the spaced apart top electrode of OLED device 36 contacts the spaced apart bottom electrode of OLED device 34; and so on. In operation a voltage is applied between the top electrode 62 of device 32 and the bottom electrode 28 of device 38 and the operating current flows from one device into the next causing all device to emit simultaneously. The drive voltage is the sum of that of the four OLED devices 32, 34, 36 and 38, but the drive current is that of a single OLED device which is only one quarter of that of a single OLED device of equivalent total area as the OLED apparatus 300. Since the power loss due to series resistance equals the square of the operating current times the series resistance, it is drastically reduced when compared with an OLED including a single OLED device instead of four OLED devices. The spaced apart organic EL elements and the spaced apart top electrodes can be prepared by conventional masking, printing, or scribing methods similar to those used for making spaced apart bottom electrodes and selected based on the organic materials and top electrode materials used.

OLED devices 32, 34, 36, and 38 can also be stacked OLED devices. In this case each OLED device 32, 34, 36, and 38 includes a space apart top electrode, a spaced apart bottom electrode, and a plurality of individual light emitting devices stacked between the two electrodes. There can be inter-device electrodes between the neighboring individual light emitting devices, as taught in U.S. Pat. No. 6,337,492. Alternatively, according to U.S. patent application Ser. No. 10/077,270 filed Feb. 15, 2002 entitled "Providing an Organic Electroluminescent Device Having Stacked Electroluminescent Units" by Liang-Sheng L. Liao et al., doped organic connectors can be used between the individual light emitting devices. FIG. 7a is a schematic representation of the cross section of an OLED apparatus 400 including a plurality of stacked OLED devices having transparent inter-device electrodes. For ease of illustration, each OLD devices 32, 34, 36, and 38 includes three individual light emitting devices. OLED device 32, for example, includes three individual light emitting devices 32a, 32b, 32c. The top individual light emitting device 32a includes a spaced apart top electrode 62a, a spaced apart light emitting element 42a, and a spaced apart inter-device electrode 22a; the middle individual emitting device 32b includes a spaced apart inter-device electrode 62b, a spaced apart light emitting element 42b, and a spaced apart inter-device electrode 22b; the bottom individual emitting device 32c includes a spaced apart inter-device electrode 62c, a spaced apart light emitting element 42c, and a spaced apart bottom electrode 22c. The spaced apart top electrode 64a of the top individual light emitting device 34a of OLED device 34 is made to be in contact with the spaced apart bottom electrode 22c of the bottom individual light emitting device 32c of OLED device 32; The spaced apart top electrode 66a of the top individual light emitting device 36a of OLED device 36 is made to be in contact with the spaced apart bottom electrode 24c of the bottom individual light emitting device 34c of OLED device 34; the spaced apart top electrode 68a of the top individual light emitting device 38a of OLED device 38 is made to be in contact with the spaced apart bottom electrode 26c of the bottom individual light emitting device 36c of OLED device 36. OLED devices 32, 34, 36, and 38 are thus connected in series. To operate the apparatus, an electric current is applied between spaced apart top electrode 62a of the top individual light emitting device 32a of OLED device 32 and the spaced apart bottom electrode 28c of the bottom individual light emitting device 38c of OLED device 38. This current will flow through all the individual light emitting devices of all OLED devices 32, 34, 36, and 38 and cause light to emit in all the individual light emitting devices. Comparing with a conventional OLED device having the same device area and operating at the same brightness level, apparatus 400 according to the current invention will operate at twelve times the voltage but only one twelfth of the current. The loss due to series resistance is thus drastically reduced.

Staying with FIG. 7a and use individual light emitting device 32b as an example, it can be seen that the inter-device spaced apart top electrode 62b and the spaced apart bottom electrode 22b do not need to have high lateral electrical conductance. The function of these electrodes is to supply positive and negative charges into the individual organic EL element 42b, and to have enough electrical conductivity to allow current to flow through the thickness of these layers. Material with electrical resistivity as high as $10^8$ ohm-cm can be used for these inter-device electrodes if the thickness of these electrodes is small. On the other hand, the spaced apart top electrodes 62a, 64a, 66a, 68a of the uppermost individual light emitting devices 32a, 34a, 36a, 38a; and the spaced apart bottom electrodes 22c, 24c, 26c, 28c of the lowermost individual light emitting devices 32a, 34c, 36c, 38c need to have high lateral electrical conductance to reduce loss of energy due to series resistance. For these layers, the electrical resistivity needs to be $10^{-3}$ ohm-cm or lower. For fabricating OLED apparatus according to the present invention using stacked OLED devices it is in fact preferable to use materials of high electrical resistivity for the inter-device electrodes. Focusing on OLED device 38 in FIG. 7a, the spaced apart top electrode 68a extends to the left beyond the end edges of all the other layers 48a, 28a, 68b, 48b, 28b, 68c, 48c, 28c so that it is be made to contact the spaced apart bottom electrode 26c of the next OLED device 36. Using a high resistivity material for the inter-device electrode layers 28a, 68b, 28b, 68c helps preventing the individual light emitting devices from being shorted if there happen to be accidental contacts between spaced apart electrode 68a and the other inter-device electrode layers 28a, 68b, 28b, 68c.

Alternatively, stacked OLED devices as taught by above-cited U.S. patent application Ser. No. 10/077,270 by Liao et al. can be used. Instead of inter-device electrodes, doped organic connectors are used in between the stacked individual light emitting devices. FIG. 7b shows an OLED apparatus 410 according to the present invention including serially connected stacked OLED devices based on doped organic connectors. On a common substrate 10 there are four OLED devices 32, 34, 36, 38 each including a stack of three individual light emitting devices. Correspondingly there are four spaced apart top electrodes 62a, 64a, 66a, 68a; four spaced apart bottom electrodes 22c, 24c, 26c, and 28c. Between each pair of spaced apart top electrodes and spaced apart bottom electrodes, 62a and 22c; 64a and 24c; 66a and 26c; 68a and 28c, there are three individual light emitting devices connected by doped organic connectors. For example, doped organic connectors 23a and 23b are used to connect the three stacked individual devices in OLED device 32, doped organic connectors 83a and 83b are used to connect the three stacked individual devices in OLED device 38, etc. The spaced apart top electrode 64 of OLED device 34 is made to be in contact with the spaced bottom electrode 22c OLED device 32; The spaced apart top electrode 66a of OLED device 36 is made to be in contact with the spaced apart bottom electrode 24c of OLED device 34; the spaced apart top electrode 68a OLED device 38 is made to be in contact with the spaced bottom electrode 26c of OLED device 36. OLED devices 32, 34, 36, and 38 are thus connected in series. To operate the apparatus, an electric current is applied between spaced apart top electrode 62a of OLED device 32 and the spaced apart bottom electrode 28c of OLED device 38. This current will flow through all the individual light emitting devices of all OLED devices 32, 34, 36, and 38 and cause light to emit in all the individual light emitting devices. Comparing with a convention OLED device having the same device area and operating at the same brightness level, apparatus 400 according to the current invention will operate at twelve times the voltage but only one twelfth of the current. The loss due to series resistance is thus drastically reduced.

Figure 8:
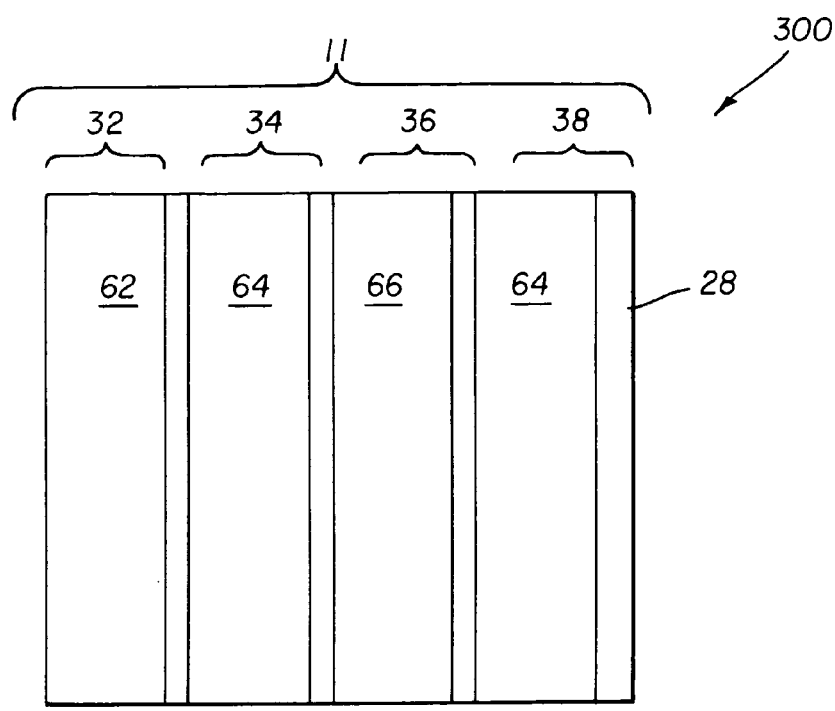
FIG. 8 is a schematic illustration of an array of electrically isolated OLED apparatus according to the current invention on a common substrate.

FIG. 8 is a schematic representation of the top view of OLED apparatus 300 showing OLED devices 32, 34, 36, 38; their corresponding spaced apart top-electrodes: 62, 64, 66, and 68; and one spaced apart bottom electrode, 28.

In addition to reducing power loss due to series resistance, another advantage of the present invention is that, when an OLED apparatus is divided into OLED devices connected in series, a shorting defect can only render the OLED device it resides in non-operative. The remaining OLED devices in the series can continue to emit light. The output of the OLED device as a whole is reduced, but this situation is much better than having the entire device totally nonoperative due to a single shorting defect.

Figure 9:
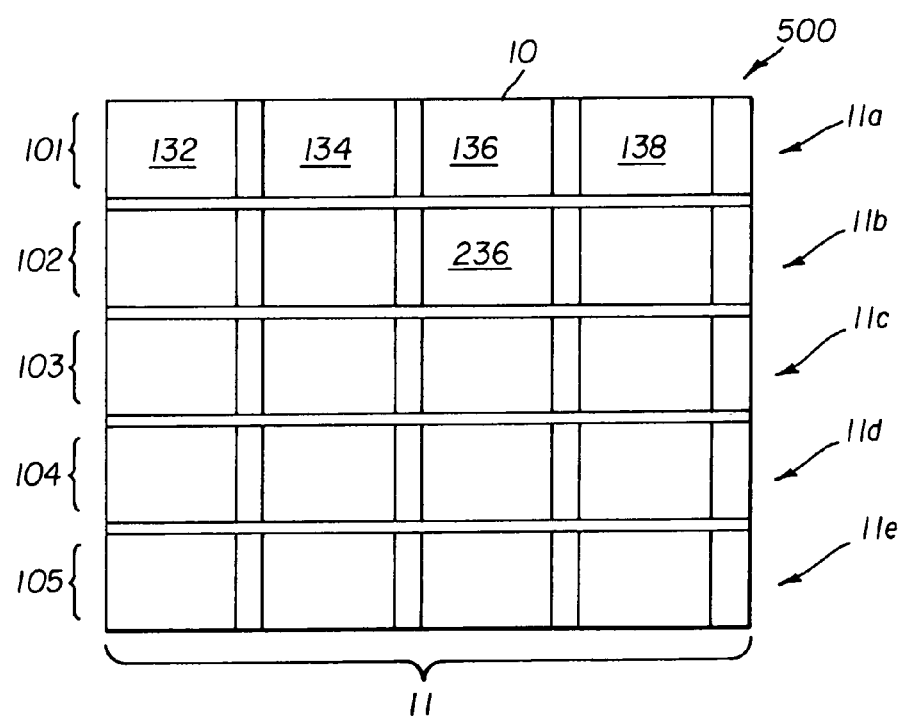
FIG. 9 is a schematic illustration of the cross section of an OLED apparatus according to the present invention using a built-in pillar structure.

FIG. 9 depicts another embodiment of the present invention showing an array 500 having an array of five strings 11a, 11b, 11c, 11d, 11e, of serially connected OLED device on a common substrate 10. Each of the five strings 11a, 11b, 11c, 11d, 11e includes four OLED devices connected in series according to the present invention. For example, string 11a includes OLED devices 132, 134, 136, and 138 connected in series. Strings 11a, 11b, 11c, 11d, 11e are electrically isolated from each other. This embodiment has several advantages. If there is a shorting defect, only the OLED device it resides in is affected. For example, if there is a shorting defect in OLED device 236 of string 11c, only OLED device 236 is affected and the total output of array 500 is only reduced by ½₀. Thus the impact of shorting defects is greatly reduced.

In another embodiment of the present invention, each strings 11a, 11b, 11c, 11d, 11e of serially connected OLED devices can contain different organic EL elements to emit light of different colors. Some of the strings can be made to emit blue lights, some red lights, and some green lights. Each strings of serially connected OLED devices can emit a single colored light so as to form a repeating pattern of different colored light. A conventional electrical structure can be used to connect the bottom electrodes of the first OLED devices of all strings of serially connected OLED devices that produce the same colored light. Similarly, the top electrodes of the last OLED devices of all strings that produce the same colored light can be connected. Strings 11a, 11b, 11c, 11d, 11e of serially connected OLED devices can also be driven independently to achieve different intensity levels. Alternatively, if strings 11a, 11b, 11c, 11d, 11e of serially connected OLED devices are not equally efficient, they can be driven to different levels to achieve uniform intensity levels.

Alternatively the top electrode of the first OLED device in each string of serially connected OLED devices of the array can be electrically connected and the bottom electrode of the last OLED device of each OLED apparatus of the array can be electrically connected. All the OLED apparatus are thus connected in parallel and can be driven off a common power supply.

Figure 10:
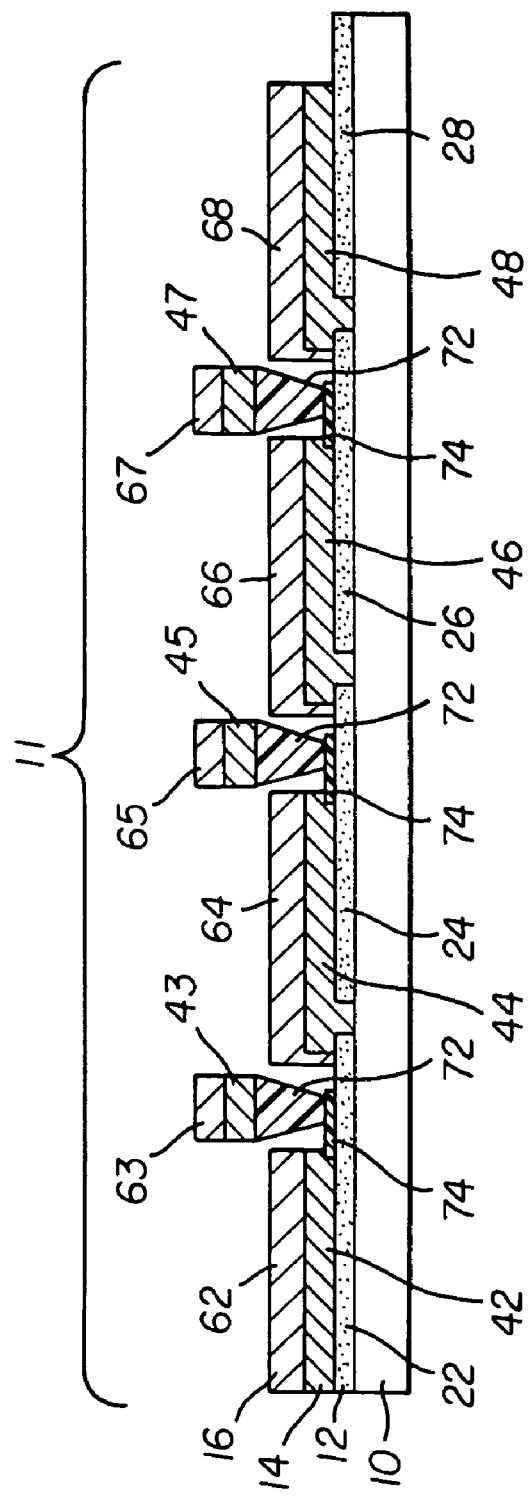
FIG. 10 depicts another embodiment of the present invention wherein pillar structures are used as built-in shadow masks for fabricating the spaced apart organic EL elements.

FIG. 10 depicts another embodiment of the current invention wherein pillar structures are used as built-in shadow masks for fabricating the spaced apart organic EL elements 42, 44, 46 and 48 and the spaced apart top electrodes 62, 64, 66, and 68. In this structure, a plurality of spaced apart bottom electrodes 22, 24, 26, and 28 are provided over substrate 10. A plurality of spaced apart pillar structures 72 and 74 are then fabricated by photolithography over the spaced apart bottom electrodes 22, 24, 26 and 28. A vacuum deposition process is then used to prepare the spaced apart organic EL element 42, 44, 46 and the 48 and the spaced apart top electrode 62, 64, 66 and 68 using pillars 72 and 74 as built-in shadow masks. The coating of organic Element materials 43, 45, 47 on top of pillars 72, and 74 and the coating of top electrode materials 63, 65, 67 on top of pillars 72 and 74 allows the spaced apart organic EL element 42, 44, 46 and 48 and the spaced apart top electrodes 62, 64, 66 and 68 to be spaced apart from each other. The position of spaced apart pillars 72 and 74 are such that each spaced apart top electrode is in contact with its next adjacent spaced apart bottom electrode to form the series connection.

The invention has been described in detail with particular reference to certain preferred embodiments thereof, but it will be understood that variations and modifications can be effected within the spirit and scope of the invention.

PARTS LIST

4 conductive elements
6 conductive elements
8 OLED device
10 substrate
10*a* substrate tab
11 string of serially connected OLED devices
11*a* string of serially connected OLED devices
11*b* string of serially connected OLED devices
11*c* string of serially connected OLED devices
11*d* string of serially connected OLED devices
11*e* string of serially connected OLED devices
12 anode layer
13 hole injecting layer
14 organic EL element
15 hole transport layer
16 cathode layer
17 light-emitting layer
18 power source
19 electron transport layer
22 spaced apart bottom electrodes
22*a* inter-device electrodes
22*b* inter-device electrodes
22*c* spaced apart bottom electrodes
23*a* doped organic connectors
23*b* doped organic connectors
24 spaced apart bottom electrodes
24*c* spaced apart bottom electrodes
26 spaced apart bottom electrodes
26*c* spaced apart bottom electrodes Parts List Cont'd
28 spaced apart bottom electrodes
28*a* inter-device electrodes
28*b* inter-device electrodes
28*c* spaced apart bottom electrodes
30 socket
30*a* socket opening
32 sub OLED devices
32*a* individual light emitting devices
32*b* individual light emitting devices
32*c* individual light emitting devices
34 sub OLED devices
34*a* individual light emitting devices
34*c* individual light emitting devices
36 sub OLED devices
36*a* individual light emitting devices
36*c* individual light emitting devices
38 sub OLED devices
38*a* individual light emitting devices
38*b* individual light emitting devices
38*c* individual light emitting devices
42 spaced apart organic EL elements
42*a* spaced apart organic EL elements
42*b* spaced apart organic EL elements
42*c* spaced apart organic EL elements
43 organic EL element materials coated on top of pillars
44 spaced apart organic EL elements
45 organic EL element materials coated on top of pillars
46 spaced apart organic EL elements
47 organic EL element materials coated on top of pillars Parts List Cont'd
48 spaced apart organic EL elements
48*a* spaced apart organic EL elements
48*b* spaced apart organic EL elements
48*c* spaced apart organic EL elements
62 spaced apart top electrode
62*a* spaced apart top electrode
62*b* inter-device electrodes
62*c* inter-device electrodes
63 top electrode materials coated on top of pillars
64 spaced apart top electrode
64*a* spaced apart top electrode
65 top electrode materials coated on top of pillars
66 spaced apart top electrode
66*a* spaced apart top electrode
67 top electrode materials coated on top of pillars
68 spaced apart top electrode
68*a* spaced apart top electrode
68*b* inter-device electrodes
68*c* inter-device electrodes
72 pillar
74 pillar
83*a* doped organic connectors
83*b* doped organic connectors
100 conventional OLED device
132 OLED device
134 OLED device
136 OLED device
138 OLED devices Parts List Cont'd
200 OLED apparatus according to the present invention
300 OLED apparatus according to the present invention
400 OLED apparatus according to the present invention
410 OLED apparatus according to the present invention
500 array
D1–D4 Diodes

What is claimed is:
1. An area illumination apparatus, comprising
  (a) a multiplicity of spaced-apart OLED devices electrically connected in series including a common substrate and each OLED device formed simultaneously over the common substrate; and
  (b) a power source connected to the first and last OLED devices of the series of spaced-apart OLED devices; and
  further comprising a socket wherein the power source is connected through the socket to the area illuminating apparatus and wherein the common substrate is removably insertable into the socket.
2. The area illumination apparatus according to claim 1 wherein the power source is 120 Volts alternating single-phase current at 60 Hz and is connected directly to the area illuminating apparatus.

3. The area illuminating apparatus according to claim 1 wherein the power source is 240 Volts alternating single-phase current at 50 Hz and is connected directly to the area illuminating apparatus.

4. The area illuminating apparatus according to claim 1 further including means for adjusting the power provided by the power source.

5. The area illuminating apparatus according to claim 4 further comprising power modification circuitry for adjusting the power from the power source and wherein the power modification circuitry is disposed within the socket.

6. The area illuminating apparatus according to claim 5 wherein the power modification circuitry for adjusting the power from the power source includes a half-wave or full-wave rectifier.

7. The area illuminating apparatus according to claim 4 wherein the power modification circuitry for adjusting the power from the power source includes a shunt capacitor across the series-connected OLED devices.

8. The area illuminating apparatus according to claim 4 wherein the power modification circuitry for adjusting the power from the power source includes a bridge rectifier.

9. The area illuminating apparatus according to claim 8 wherein the bridge rectifier is full-wave bridge rectifier.

10. The area illuminating apparatus according to claim 9 wherein the full-wave bridge rectifier includes diodes.

11. An area illumination apparatus according to claim 1 wherein:
(a) eash of the spaced-apart OLED devices formed simultaneously over the common substrae including a spaced apart bottom electrode disposed over the substrate;
(b) eash of the spaced-apart OLED devices including at least one organic layer extending over an edge of its corresponding spaced apart bottom electrode; and
(c) each one of the OLED devices including a top electrode spaced apart from the other top electrodes and extending into electrical contact with the spaced apart bottom electrode of a neighboring OLED device so that a series connection of OLED devices is provided and current flows between the spaced apart top and bottom electrodes of each OLED device and from the spaced apart bottom electrode of such OLED device to the spaced apart top electrode of the next OLED device which reduces power loss due to series resistance.

12. The area illumination apparatus according to claim 11 wherein the power source is 120 Volts alternating single-phase current at 60 Hz and is connected directly to the area illuminating apparatus.

13. The area illuminating apparatus according to claim 11 wherein the power source is 240 Volts alternating single-phase current at 50 Hz and is connected directly to the area illuminating apparatus.

14. The area illuminating apparatus according to claim 11 further including means for adjusting the power provided by the power source.

15. The area illuminating apparatus according to claim 14 further comprising power modification circuitry for adjusting the power from the power source and wherein the power apparatus modification circuitry is disposed within the socket.

16. The area illuminating apparatus according to claim 14 wherein the power modification circuitry for adjusting the power from the power source includes a half-wave or full-wave rectifier.

17. The area illuminating apparatus according to claim 14 wherein the power modification circuitry for adjusting the power from the power source includes a shunt capacitor across the series-connected OLED devices.

18. The area illuminating apparatus according to claim 14 wherein the power modification circuitry for adjusting the power from the power source includes a bridge rectifier.

19. The area illuminating apparatus according to claim 18 wherein the bridge rectifier is full-wave bridge rectifier.

20. The area illuminating apparatus according to claim 19 wherein the full-wave bridge rectifier includes diodes.

21. An area illumination apparatus according to claim 1, further comprising
a plurality of strings of serially connected OLED devices including the common substrate and each OLED device formed simultaneously over the common substrate; and
wherein the power source is connected to the first and last OLED devices in each of the strings of serially connected OLED devices.

22. The area illuminating apparatus according to claim 21 wherein the power source is 120 Volts alternating single-phase current at 60 Hz and is connected directly to the area illuminating apparatus.

23. The area illuminating apparatus according to claim 21 wherein the power source is 240 Volts alternating single-phase current at 50 Hz and is connected directly to the area illuminating apparatus.

24. The area illuminating apparatus according to claim 21 further including means for adjusting the power provided by the power source.

25. The area illuminating apparatus according to claim 24 further comprising power modification circuitry for adjusting the power from the power source and wherein the power modification circuitry is disposed within the socket.

26. The area illuminating apparatus according to claim 24 wherein the power modification circuitry for adjusting the power from the power source includes a half-wave or full-wave rectifier.

27. The area illuminating apparatus according to claim 24 wherein the power modification circuitry for adjusting the power from the power source includes a shunt capacitor across the series-connected OLED devices.

28. The area illuminating apparatus according to claim 24 wherein the power modification circuitry for adjusting the power from the power source includes a bridge rectifier.

29. The area illuminating apparatus according to claim 28 wherein the bridge rectifier is full-wave bridge rectifier.

30. The area illuminating apparatus according to claim 29 wherein the full-wave bridge rectifier includes diodes.

31. The area illumination apparatus according to claim 21 wherein the strings of serially connected OLED devices are grouped in pairs and one string of serially connected OLED devices of each pair is electrically connected in reverse of the other string of serially connected OLED devices in the pair.

32. An area illumination apparatus comprising
(a) a plurality of strings of serially connected OLED devices including a common substrate and each OLED device formed simultaneously over the common substrate; and
(b) a power source connected to the first and last OLED devices in each of the strings of serially connected OLED devices;
wherein the strings of serially connected OLED devices are grouped in fours and each string of serially connected OLED devices of each group of four is driven sequentially 90 degrees out of phase.

33. The area illuminating apparatus according to claim 21 wherein the plurality of strings of serially connected OLED devices have separate power connections to provide variable lighting.

34. The area illuminating apparatus of claim 33 wherein the separate power connections include a single switch that sequentially powers the plurality of strings of serially connected OLED devices.

35. The area illuminating apparatus according to 21 wherein the plurality of strings of serially connected OLED devices have separate power connections so as to permit variable lighting and the separate power connections include a single switch that sequentially powers the plurality of strings of serially connected OLED devices.

36. The area illuminating apparatus according to claim 21 wherein the plurality of strings of serially connected OLED devices produce different colored light.

37. An area illumination apparatus according to claim 1 wherein each spaced-apart OLED devices is a stacked OLED device.

38. An area illumination apparatus according to claim 37 wherein each spaced-apart OLED device is a stacked OLED device including doped organic connector disposed between neighboring individual light emitting devices.

39. An area illumination apparatus according to claim 37 wherein each spaced-apart OLED device is a stacked OLED device including inter-device electrodes disposed between neighboring individual light emitting devices.

40. An area illumination apparatus according to claim 21 wherein each spaced-apart OLED device is a stacked OLED device.

41. An area illumination apparatus according to claim 40 wherein each spaced-apart OLED device is a stacked OLED device including doped organic connector disposed between neighboring individual light emitting devices.

42. An area illumination apparatus according to claim 41 wherein each spaced-apart OLED device is a stacked OLED device including inter-device electrodes disposed between neighboring individual light emitting devices.

* * * * *